(12) United States Patent
Zi et al.

(10) Patent No.: US 11,036,137 B2
(45) Date of Patent: Jun. 15, 2021

(54) METHOD FOR FORMING SEMICONDUCTOR STRUCTURE

(71) Applicant: Taiwan Semiconductor Manufacturing Co., Ltd., Hsinchu (TW)

(72) Inventors: An-Ren Zi, Hsinchu (TW); Ching-Yu Chang, Yuansun Village (TW); Chin-Hsiang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/898,681

(22) Filed: Jun. 11, 2020

(65) Prior Publication Data

US 2020/0301280 A1    Sep. 24, 2020

Related U.S. Application Data

(63) Continuation of application No. 16/021,665, filed on Jun. 28, 2018, now Pat. No. 10,684,545.

(Continued)

(51) Int. Cl.
*H01L 21/027* (2006.01)
*G03F 7/11* (2006.01)
(Continued)

(52) U.S. Cl.
CPC .............. *G03F 7/11* (2013.01); *G03F 7/0045* (2013.01); *G03F 7/038* (2013.01); *G03F 7/0382* (2013.01);
(Continued)

(58) Field of Classification Search
CPC .......... G03F 7/11; G03F 7/325; G03F 7/0392; G03F 7/0752; G03F 7/0045; G03F 7/2004; G03F 7/2006; G03F 7/322; G03F 7/038; G03F 7/0382; G03F 7/094; G03F 7/38; G03F 7/20–24; G03F 7/70–70991; H01L 21/0274; H01L 21/0276; H01L 29/66795;
(Continued)

(56) References Cited

U.S. PATENT DOCUMENTS 7,282,305 B2    10/2007 Shoki et al.
8,764,995 B2    7/2014 Chang et al.
(Continued)

FOREIGN PATENT DOCUMENTS

CN    106249539 A    12/2016
CN    106855680 A    6/2017
(Continued)

*Primary Examiner* — Shahed Ahmed
(74) *Attorney, Agent, or Firm* — Birch, Stewart, Kolasch & Birch, LLP

(57) ABSTRACT

A method for forming a semiconductor device structure is provided. The method includes forming an assist layer over a material layer. The assist layer includes a first polymer with a first polymer backbone, a floating group bonded to the first polymer backbone, and the floating group includes carbon fluoride (CxFy), and a second polymer. The method includes forming a resist layer over the assist layer, and the first polymer is closer to an interface between the assist layer and the resist layer than the second polymer. The method also includes patterning the resist layer.

20 Claims, 10 Drawing Sheets

Related U.S. Application Data

(60) Provisional application No. 62/587,871, filed on Nov. 17, 2017.

(51) Int. Cl.

| | | |
|---|---|---|
| *G03F 7/004* | (2006.01) | |
| *G03F 7/20* | (2006.01) | |
| *H01L 29/66* | (2006.01) | |
| *G03F 7/32* | (2006.01) | |
| *G03F 7/038* | (2006.01) | |
| *G03F 7/09* | (2006.01) | |
| *H01L 21/266* | (2006.01) | |
| *G03F 7/38* | (2006.01) | |
| *G03F 7/039* | (2006.01) | |
| *G03F 7/075* | (2006.01) | |

(52) U.S. Cl.
CPC .......... *G03F 7/0392* (2013.01); *G03F 7/0752* (2013.01); *G03F 7/094* (2013.01); *G03F 7/2004* (2013.01); *G03F 7/2006* (2013.01); *G03F 7/322* (2013.01); *G03F 7/325* (2013.01); *G03F 7/38* (2013.01); *H01L 21/0274* (2013.01); *H01L 21/0276* (2013.01); *H01L 21/266* (2013.01); *H01L 29/66795* (2013.01)

(58) Field of Classification Search
CPC ..... H01L 21/266; H01L 21/0273–0279; H01L 21/312–3128
See application file for complete search history.

(56) References Cited

U.S. PATENT DOCUMENTS

| | | | |
|---|---|---|---|
| 8,796,666 | B1 | 8/2014 | Huang et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 2006/0068318 | A1* | 3/2006 | Meagley ............... G03F 7/0392 430/270.1 |
| 2010/0316950 | A1 | 12/2010 | Oguro et al. |
| 2011/0008968 | A1 | 1/2011 | Chang |
| 2014/0011133 | A1 | 1/2014 | Liu et al. |
| 2014/0272709 | A1* | 9/2014 | Liu ........................ G03F 7/11 430/272.1 |
| 2015/0241776 | A1 | 8/2015 | Chien et al. |
| 2016/0013041 | A1* | 1/2016 | Liu ........................ G03F 7/40 438/703 |
| 2016/0033869 | A1* | 2/2016 | Hustad .................. G03F 7/0397 438/761 |
| 2016/0093493 | A1 | 3/2016 | Chang et al. |
| 2016/0238933 | A1 | 8/2016 | Su et al. |
| 2016/0299428 | A1 | 10/2016 | Masunaga et al. |
| 2017/0227851 | A1* | 8/2017 | Lai ........................ G03F 7/075 |

FOREIGN PATENT DOCUMENTS

| | | |
|---|---|---|
| TW | 536738 B | 6/2003 |
| TW | 201543165 A | 11/2015 |

* cited by examiner

METHOD FOR FORMING SEMICONDUCTOR STRUCTURE

CROSS REFERENCE TO RELATED APPLICATIONS

This is a Continuation application of U.S. patent application Ser. No. 16/021,665, filed on Jun. 28, 2018, which claims the benefit of U.S. Provisional Application No. 62/587,871 filed on Nov. 17, 2017, which is incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
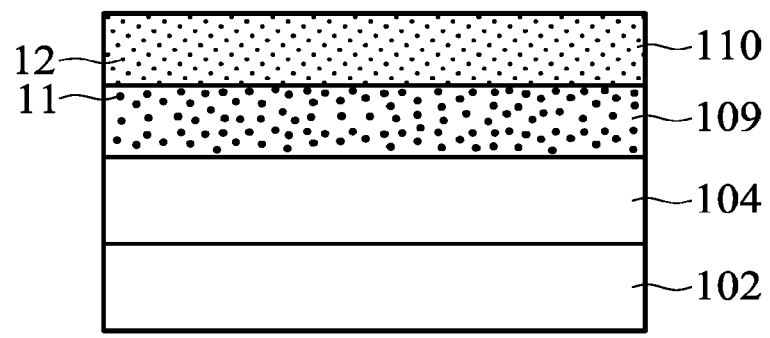
FIGS. 1A-1E show cross-sectional representations of various stages of forming a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Embodiments for a semiconductor structure and method for forming the same are provided. FIGS. 1A-1E show cross-sectional representations of various stages of forming a semiconductor structure, in accordance with some embodiments of the disclosure. The method can be used in many applications, such as fin-type field effect transistor (FinFET) device structure.

Referring to FIG. 1A, a substrate 102 is provided. The substrate 102 may be made of silicon or other semiconductor materials. In some embodiments, the substrate 102 is a wafer. Alternatively or additionally, the substrate 102 may include other elementary semiconductor materials such as germanium (Ge). In some embodiments, the substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Some device elements may be formed over the substrate 102. The device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes.

The substrate 102 may include various doped regions such as p-type wells or n-type wells). Doped regions may be doped with p-type dopants, such as boron or $BF_2$, and/or n-type dopants, such as phosphorus (P) or arsenic (As). In some other embodiments, the doped regions may be formed directly on the substrate 102.

The substrate 102 also includes isolation structures (not shown). The isolation structure is used to define and electrically isolate various devices formed in and/or over the substrate 102. In some embodiments, the isolation structure includes shallow trench isolation (STI) structure, local oxidation of silicon (LOCOS) structure, or another applicable isolation structure. In some embodiments, the isolation structure includes silicon oxide, silicon nitride, silicon oxynitride, fluoride-doped silicate glass (FSG), or another suitable material.

Afterwards, a material layer 104 is formed over the substrate 102, and a assist layer 109 is formed over the material layer 104. Afterwards, a resist layer 110 is formed over the assist layer 109. In some embodiments, the material layer 104, the assist layer 109, and the resist layer 110 are independently formed by a deposition process, such as a spin-on coating process, chemical vapor deposition process (CVD), physical vapor deposition (PVD) process, and/or other suitable deposition processes.

Figure 2:
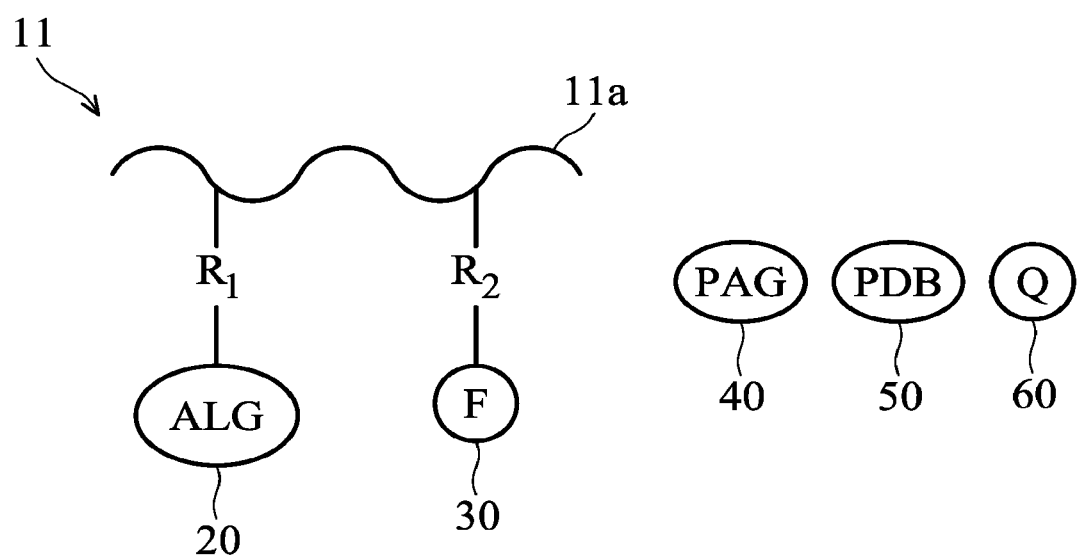
FIG. 2 shows a diagrammatical view of a chemical structure of the assist layer, in accordance with some embodiments.

FIG. 2 shows a diagrammatical view of a chemical structure of the assist layer 109, in accordance with some embodiments. As shown in FIG. 2, the assist layer 109 includes a first polymer 11, and a solvent.

The first polymer 11 includes a first polymer backbone 11a, and an acid labile group (ALG) 20 and a floating (F) group 30 are bonded to the first polymer backbone 11a. It should be noted that the ALG 20 and the floating group 30 both connected to the first polymer backbone 11a are used to prevent the resist layer 110 from collapsing.

In some embodiments, the assist layer may further include a photoacid generator (PAG) 40. The PAG 40 in the assist layer 109 generates acid when the assist layer 109 is exposed to the radiation energy and absorbs the radiation. The acid labile group (ALG) 20 cleaves from the first polymer 11 when the assist layer 110 is in the acidic environment. In other words, the PAG 40 catalyzes cleaving of ALG 20 from the first polymer 11 when the assist layer 109 is exposed to radiation. As a result, the polarity and/or solubility of the exposed region of the assist layer 109 are changed. The floating group (F) 30 in the assist layer 109 provides the "floating" properties of the resist layer 110. Therefore, the first polymer 11 is close to the resist layer 110.

The ALG 20 is bonded to the first polymer backbone 11a via a first connector $R_1$. In some embodiments, the first connector $R_1$ includes linear, branched, cyclic or noncyclic aliphatic hydrocarbon group comprising 1 to 9 carbon atoms with hydrogen or halogen (e.g., alkyl, alkene), or —S—; —P—; —P(O$_2$)—; —C(=O)S—; —C(=O)O—; —O—; —N—; —C(=O)N—; —SO$_2$O—; —SO$_2$O—; —SO$_2$S—; —SO— —SO$_2$—, carboxylic acid, ether, ketone, ester unit and/or other suitable components. In some embodiments, the ALG 20 includes a polarity switch unit, and the polarity switch unit includes acetal, acetonide or anhydride. The polarity switch unit of the ALG 20 provides a polar force to make the ALG have a tendency to stay within the assist layer 109, which results in reducing mass loss of the assist layer 109.

In some embodiments, the ALG 20 includes formula (I), (II), (III), (IV), (V), (VI), (VII) or (VIII).

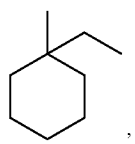
(I)

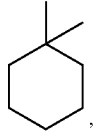
(II)

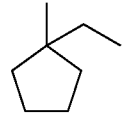
(III)

(IV)

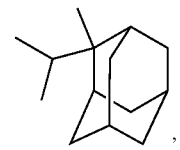
(V)

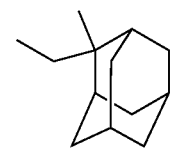
(VI)

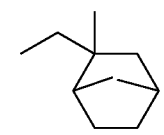
(VII)

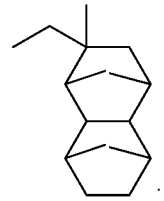
(VIII)

The floating group (F) 30 is bonded to first polymer backbone 11a via a second connector $R_2$. In some embodiments, the second connector $R_2$ includes linear, branched, cyclic or noncyclic aliphatic hydrocarbon group comprising 1 to 9 carbon atoms with hydrogen or halogen (e.g., alkyl, alkene), or —S—; —P—; —P(O$_2$)—; —C(=O)S—; —C(=O)O—; —O—; —N—; —C(=O)N—; —SO$_2$O—; —SO$_2$S—; —SO—; —SO$_2$—, carboxylic acid, ether, ketone, ester unit and/or other suitable components.

In some embodiments, the floating group (F) 30 includes carbon fluoride (CxFy) including substituted or unsubstituted linear, branched aliphatic hydrocarbon group comprising 1 to 9 carbon atoms. In some embodiments, the floating group (F) 30 includes formula (IX), (X), (XI), (XII), (XIII) or (XIV).

(IX)

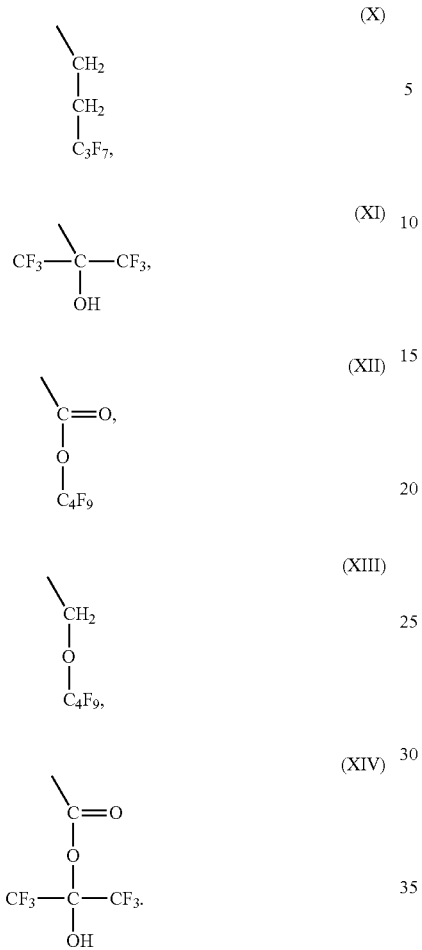

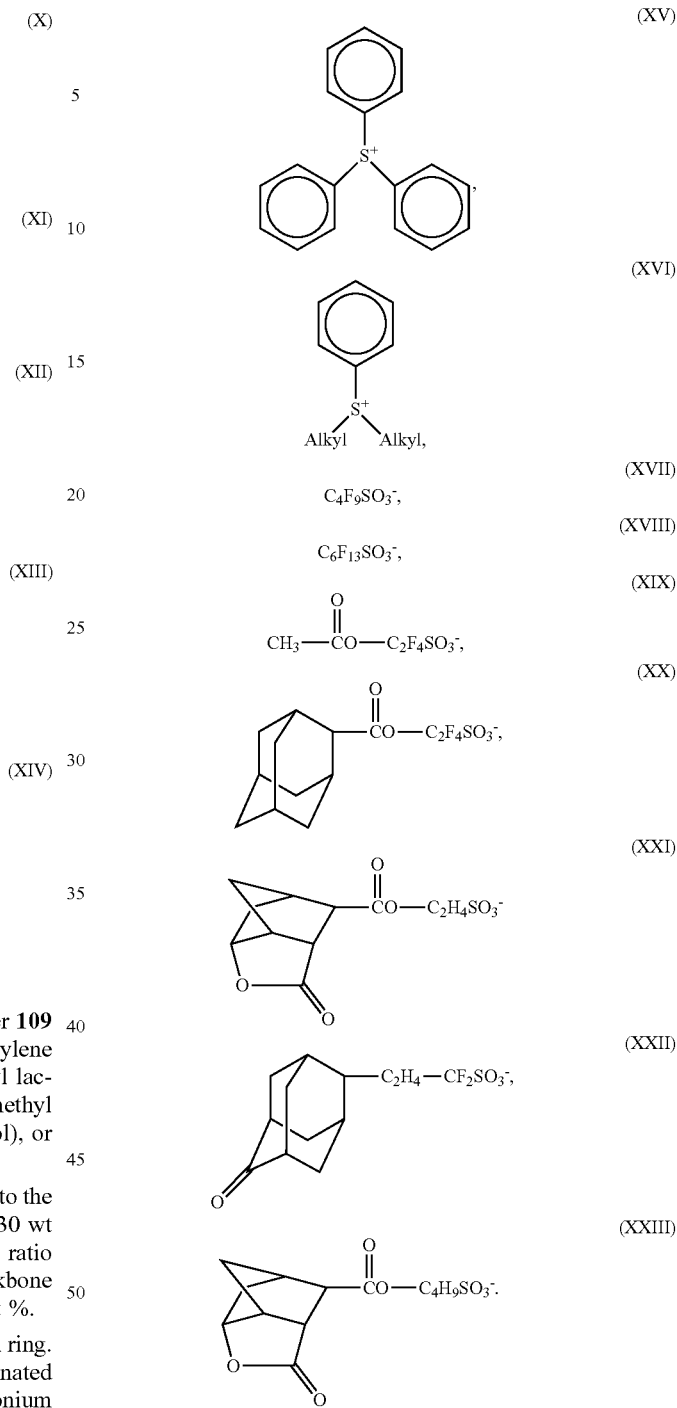

In some embodiments, the solvent in the assist layer 109 includes propylene glycol methyl ether acetate, propylene glycol monomethyl ether, gamma-butyrolactone, ethyl lactate, cyclohexanone, n-butyl actetate, ethyl ketone, dimethyl formamide, alcohol (e.g., isopropyl alcohol or ethanol), or another suitable solvent.

In some embodiments, a weight ratio of the ALG 20 to the first polymer backbone 11a is in a range from about 30 wt % to about 70 wt %. In some embodiments, a weight ratio of the floating group (F) 30 to the first polymer backbone 11a is in a range from about 30 wt % to about 70 wt %.

In some embodiments, the PAG 40 includes a phenyl ring. In some embodiments, the PAG 40 includes halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and s-triazine derivatives.

In some embodiments, the PAG 40 includes a cation and an anion. In some embodiments, the cation includes formula (XV), (XVI). In some embodiments, the anion includes formula (XVII), (XVIII), (XIX), (XX), (XXI), (XXII) or (XXIII).

In some other embodiments, the assist layer 109 further includes a photo decomposable base (PDB) 50. In the exposed region, the photo decomposable base (PDB) 50 is a base which will be decomposed when it is exposed to light. In some embodiments, the photo decomposable base (PDB) 50 includes formula (XXIV), wherein $R_1$ represents an alicyclic group of 5 or more carbon atoms which may have a substituent; X represents a divalent linking group; Y represents a linear, branched or cyclic alkylene group or an arylene group; $R_f$ represents a hydrocarbon group containing a fluorine atom; and M+ represents an organic cation or a metal cation.

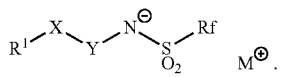 (XXIV)

In some embodiments, the photo decomposable base (PDB) 50 includes a cation and an anion. In some embodiments, the cation includes formula (XV), (XVI) shown in above. In some embodiments, the anion includes formula (XXV), (XXVI), (XXVII), (XXVIII), (XXIX), or (XXX).

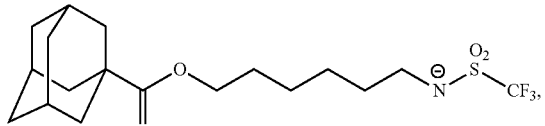 (XXV)

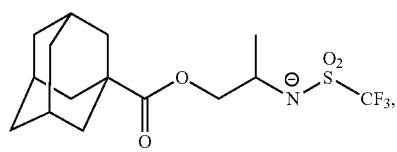 (XXVI)

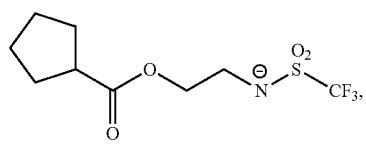 (XXVII)

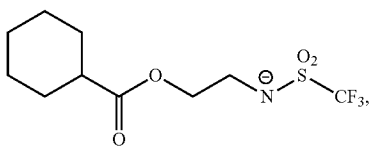 (XXVIII)

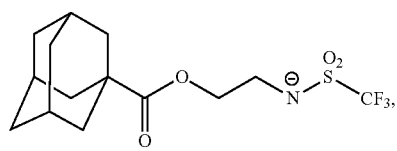 (XXIX)

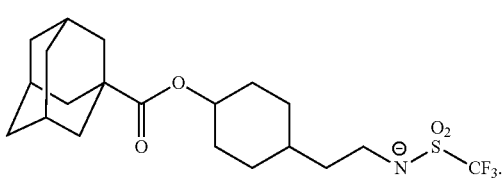 (XXX)

In some other embodiments, the assist layer 109 further includes a quencher (Q) 60. In some embodiments, the quencher (Q) 60 includes formula (XXXI), (XXXII), (XXXIII), (XXXIV) or (XXXV).

(XXXI)

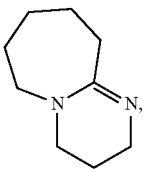

(XXXII)

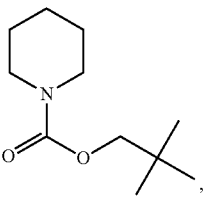

(XXXIII)

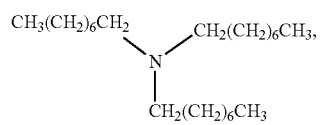

(XXXIV)

$CH_3(CH_2)_6CH_2$ \ N / $CH_2(CH_2)_6CH_3$,
$CH_2(CH_2)_6CH_3$ (XXXV)

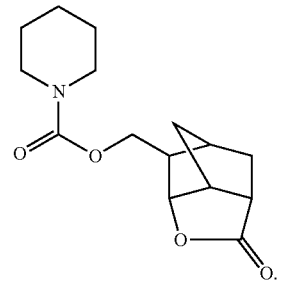

In some embodiments, the resist layer 110 includes a chemically amplified resist (CAR) material. The CAR material is used to improve sensitivity of the resist layer 110. The CAR material can generate multiple chemical reactions upon exposure to radiation, thereby chemically amplifying a response to the radiation. In some embodiments, the resist layer 110 includes a compound 12 (shown in FIG. 3A) and an additive. In some embodiments, the compound 12 includes a second polymer, and ALG 20 is bonded to the second polymer. The additive includes a photoacid generator (PAG) and a photo decomposable base (PDB). It should be noted that the second polymer 12 in the resist layer 110 is different from the first polymer 11 in the assist layer 109.

The PAG in the resist layer 110 generates acid when the resist layer 110 is exposed to the radiation energy and absorbs the radiation. The acid labile group (ALG) 20 cleaves from the second polymer when the resist layer 110 is in the acidic environment. In other words, the PAG catalyzes cleaving of ALG from the second polymer 12 when the resist layer 110 is exposed to radiation. As a result, the polarity and/or solubility of the exposed region of the resist layer 110 are changed.

The assist layer 109 has a first thickness $T_1$ in a vertical direction, and the resist layer 110 has a second thickness $T_2$ in a vertical direction. In some embodiments, the first thickness $T_1$ is in a range from about 2 nm to about 50 nm. In some other embodiments, the second thickness $T_2$ is in a range from about 10 nm to about 50 nm.

Figure 1B:
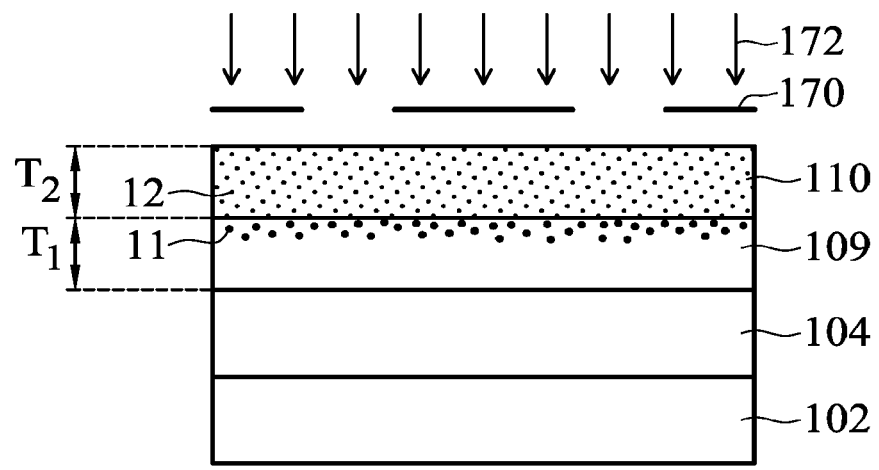

Next, as shown in FIG. 1B, a mask 170 is formed over the resist layer 110, and an exposure process 172 is performed on the resist layer 110 to form an exposed region and an unexposed region, in accordance with some embodiments of the disclosure. The radiation energy of the exposure process 172 may include a 248 nm beam by Krypton Fluoride (KrF) excimer lasers, a 193 nm beam by Argon Fluoride (ArF) excimer lasers, a 157 nm beam by Fluoride ($F_2$) Excimer Lasers, or Extreme ultra-violet (EUV) light, such as EUV light with wavelength of about 13.5 nm.

After the exposure process 172, a post-exposure-baking (PEB) process is performed. In some embodiments, the PEB process includes using a microwave or an IR lamping heating process. In some embodiments, the PEB process is performed at a temperature in a range from about 120 degrees to about 350 degrees. In some other embodiments, the PEB process is performed for a period of time in a range from about 500 µs to about 30 seconds. It should be noted that since the microwave or the IR lamping heating process can provide the heat uniformly, the resist layer 110 is baked at a certain temperature uniformly by using the microwave or the IR lamping heating process. The chemical reaction in the resist layer 110 can react quickly by providing heat uniformly. As a result, the heating time of the baking process may be reduced to be shorter than 30 seconds.

Figure 3A:
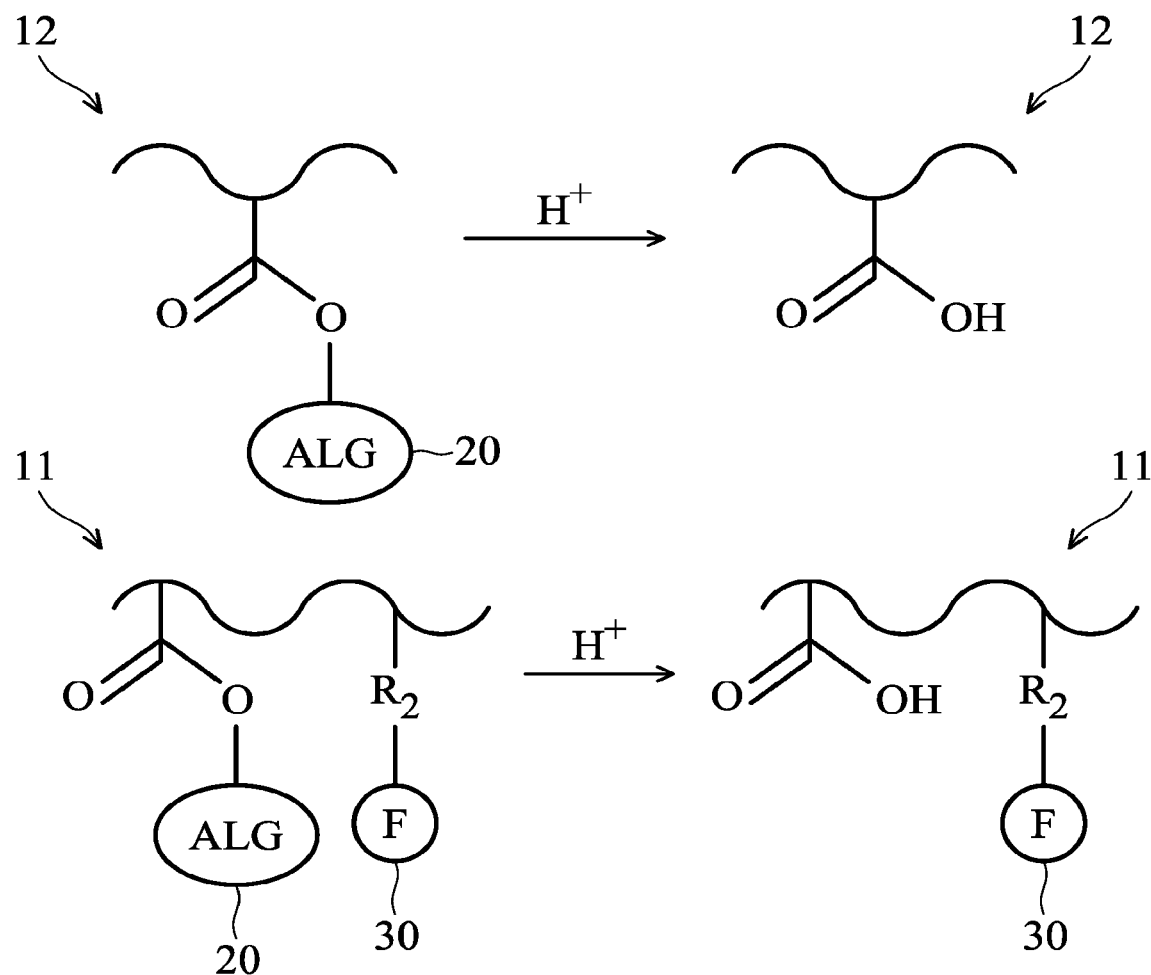
FIGS. 3A-3B show schematic diagrams that show reactions occurring in the resist layer and the assist layer when the exposure process is performed in a photolithography process, in accordance with some embodiments.
Figure 3B:
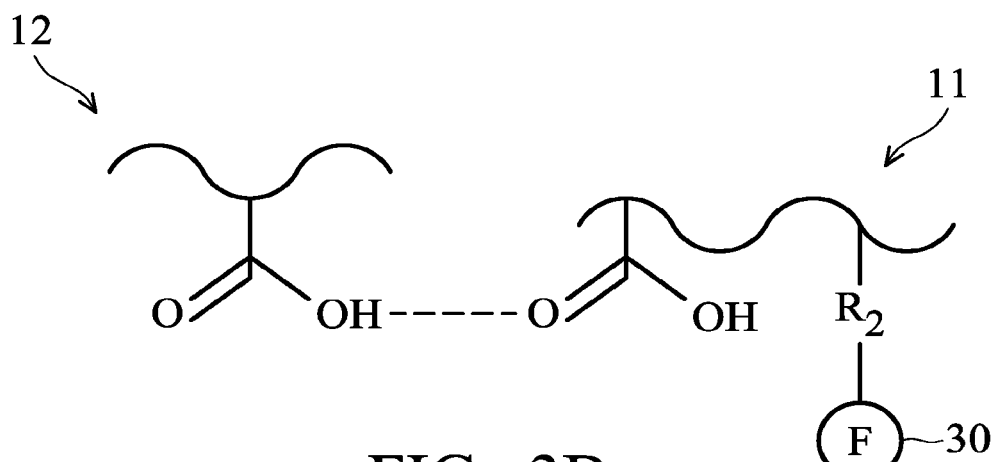

FIGS. 3A-3B show schematic diagrams that show reactions occurring in the resist layer 110 and the assist layer 109 when the exposure process 172 is performed in a photolithography process, in accordance with some embodiments.

As shown in FIG. 3A, as mentioned above, the ALG 20 cleaves from the second polymer 12 when the resist layer 110 is in the acidic environment. After the ALG 20 is released from the second polymer 12 of the resist layer 110, the carboxylic acid group is formed in the second polymer 12. In addition, the ALG 20 cleaves from the first polymer 11 when the assist layer 109 is in the acidic environment. After the ALG 20 is released from the first polymer 11, the carboxylic acid group is formed in the first polymer 11.

As shown in FIG. 3B, when the first polymer 11 in the assist layer 109 is floating to be close to the second polymer 12 in the resist layer 110, a chemical reaction is between the carboxylic acid group in the first polymer 11 and the carboxylic acid group in the second polymer 12. More specifically, a hydrogen bond is formed between the carboxylic acid group in the first polymer 11 and the carboxylic acid group in the second polymer 12.

After the exposure process 172, the exposed region of the resist layer 110 becomes hydrophilic. In addition, the exposed region of the assist layer 109 becomes hydrophilic. In some embodiments, the water contact angle of the assist layer 109 is changed from 70° to about 89° to about 40° to about 60° before the exposure process 172 and after the exposure process 172. The data shows that the assist layer 109 becomes more hydrophilic after the exposure process 172.

It should be noted that the chemical bonding (e.g. hydrogen bond) between the resist layer 110 and the assist layer 109 is used to prevent the resist layer 110 from collapsing. Therefore, the pattern resolution of the resist layer 110 is improved. Furthermore, the floating group 30 is used to float the first polymer 11 to increase the interaction between the first polymer 11 and the second polymer 12. In some embodiments, the average molecular weight (Mw) of the first polymer 11 is in a range from about 6,000 to about 20,000. When the average molecular weight (Mw) of the first polymer 11 is within above-mentioned range, the pattern resolution of the resist layer 110 is improved.

Figure 1C:
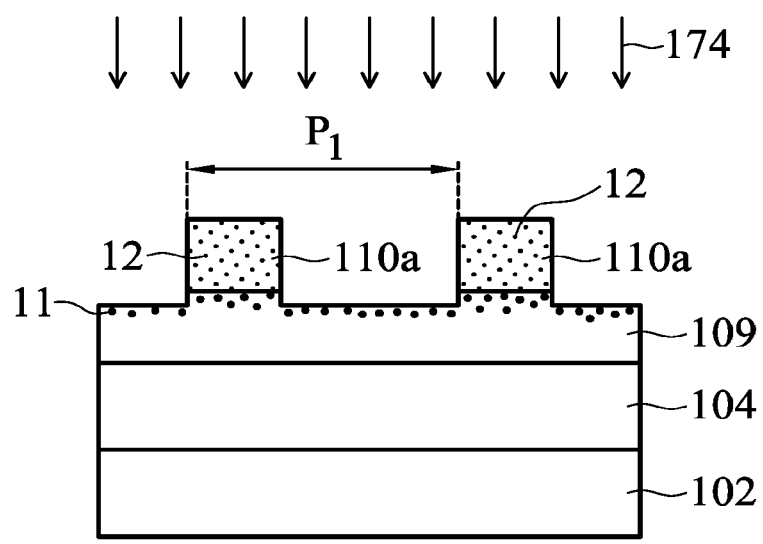

Next, as shown in FIG. 1C, the resist layer 110 is developed by performing a first develop process 174 to form a patterned resist layer 110a, in accordance with some embodiments of the disclosure.

There are two types of developing processes: a positive tone development (PTD) process and a negative tone development (NTD) process. The PTD process uses a positive tone developer, which generally refers to a developer that selectively dissolves and removes exposed portions of the resist layer. The NTD process uses a negative tone developer, which generally refers to a developer that selectively dissolves and removes unexposed portions of the resist layer. In some embodiments, the PTD developers are aqueous base developers, such as tetraalkylammonium hydroxide (TMAH). In some embodiments, the NTD developers are organic-based developers, such as n-butyl acetate (n-BA). As shown in FIG. 1C, in some embodiments, the negative tone developer (NTD) process is performed, the exposed region of the resist layer 110 remains, and the unexposed region of the resist layer 110 is removed by the developer.

The exposed region of the resist layer 110 has a number of protruding structures. In some embodiments, there is a pitch Pi which is a distance between the left sidewall surface of the first protruding structure and the left sidewall surface of the second protruding structure. In some embodiments, the pitch Pi is in a range from about 10 nm to about 40 nm.

Figure 1D:
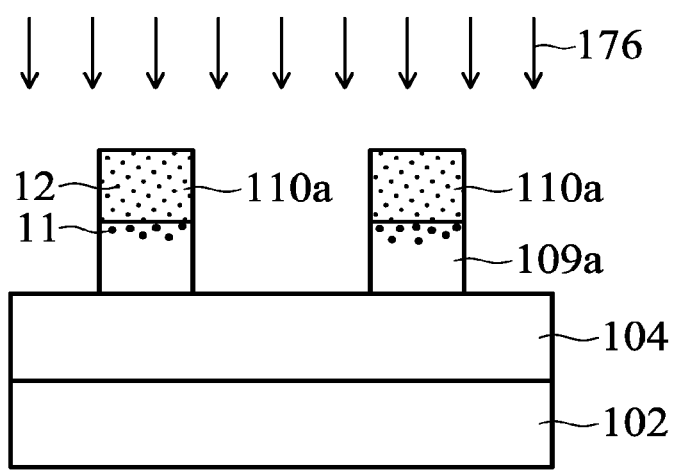

Afterwards, as shown in FIG. 1D, the assist layer 109 is patterned by performing a second develop process 176 to form a patterned assist layer 109a, in accordance with some embodiments of the disclosure.

In some embodiments, a portion of the assist layer 109 is removed along with the resist layer 110. It should be noted that since the resist layer 110 and the assist layer 109 are made of different materials, the assist layer 109 is not completely removed by the first develop process 174. Therefore, the second develop process 176 is used to remove a portion of the assist layer 109 which is not covered by the patterned resist layer 110a.

Figure 1E:
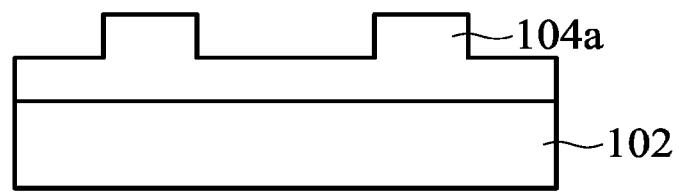

Next, as shown in FIG. 1E, a portion of the material layer 104 is removed by performing an etching process and using the patterned resist layer 110a and the patterned assist layer 109a as a mask. The etching process includes a number of etching processes. The etching process may be a dry etching process or a wet etching process. Afterwards, the patterned resist layer 110a is removed. In some embodiments, the patterned resist layer 110a is removed by the wet etching process including a base solution, and the base solution is tetraalkylammonium hydroxide (TMAH).

The assist layer 109 and the resist layer 110 may be made of different materials. For instance, the assist layer 109 may be used as an adhesion layer between the material layer 104 and the resist layer 110. Since the first polymer 11 floats to the upper surface of the assist layer 109, the first polymer 11 is close to the interface between the assist layer 109 and the resist layer 110. Therefore, the resist layer 110 may not easily collapse by the intermolecular force between the first polymer 11 and the second polymer 12. Furthermore, the assist layer 109 with PAG 40 is formed below the resist layer 110, the PAG 40 in the assist layer 109 is used to increase the amount of the photo absorption. Therefore, the contrast of the resist layer 110 is improved, and the line width roughness (LWR) of the resist layer 110 is further improved.

The assist layer 109 is used to improve the pattern of the resist layer 110. With the help of the assist layer 109, the line width roughness (LWR) of the resist layer 110 is reduced by about 10% to about 50%. The line width roughness (LWR) of the resist layer 110 is improved to about 0.1 nm to about 2 nm. In addition, the collapse window is enlarged by about 0.5 nm to about 2 nm. Therefore, the lithography resolution is improved.

FIGS. 4A-4E show cross-sectional representations of various stages of forming a semiconductor structure, in accordance with some embodiments of the disclosure. The method can be used in many applications, such as fin-type field effect transistor (FinFET) device structure. Some processes and materials used to form the semiconductor device structure in FIGS. 4A-4E are similar to, or the same as, those used to form the semiconductor device structure FIGS. 1A-1E and are not repeated herein.

Figure 4A:
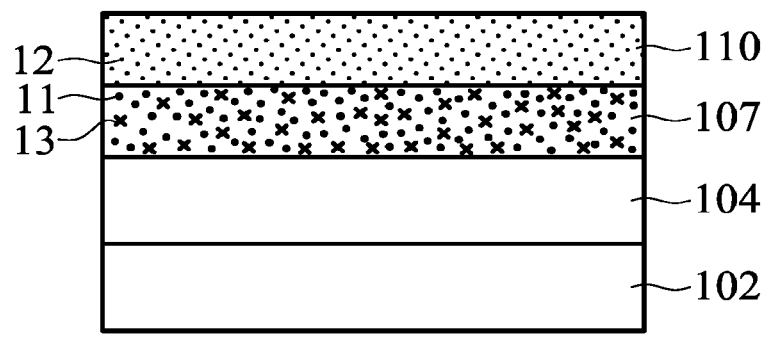
FIGS. 4A-4E show cross-sectional representations of various stages of forming a semiconductor structure, in accordance with some embodiments of the disclosure.

As shown in FIG. 4A, the resist layer 110 is formed over the material layer 104, and an underlying layer 107 is formed below the resist layer 110. The underlying layer 107 is between the material layer 104 and the resist layer 110.

The underlying layer 107 is configured to prevent the resist layer 110 from collapsing. The underlying layer 107 includes the first polymer 11 as shown in FIG. 2 and a compound 13. The underlying layer 107 may have an anti-reflection property. In some embodiments, the underlying layer 107 is a bottom anti-reflective coating (BARC) layer. It should be noted that the compound 13 is different from the first polymer 11. The underlying layer 107 is formed by depositing a material including a mixture of the compound 13 and the first polymer 11 as shown in FIG. 2.

In some embodiments, the compound 13 is a third polymer. In some embodiments, the compound 13 made of a polymer, and the first polymer 11 react with the compound 13 to form a co-polymer. In some embodiments, the compound 13 includes silicon containing inorganic polymer which is used as a middle layer (ML) of a tri-layer photoresist structure. In some other embodiments, the compound 13 includes novolac resin, such as a chemical structure having multiple phenol units bonded together. The novolac resin may use as a bottom layer (BL) of a tri-layer photoresist structure.

Figure 4B:
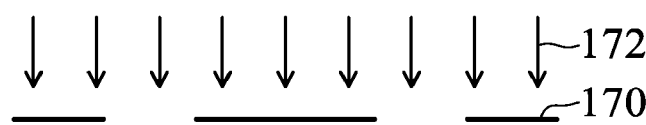
Figure 4B:
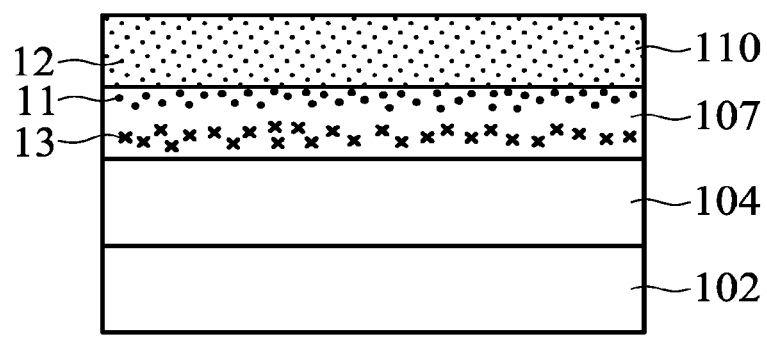

Afterwards, as shown in FIG. 4B, the mask 170 is formed over the resist layer 110, and the exposure process 172 is performed on the resist layer 110. After the exposure process 172, a post-exposure-baking (PEB) process is performed. After the PEB process, the ALG 20 is cleaved from the second polymer 12 to form a carboxylic acid group. As a result, the polarity and/or solubility of the exposed region of the resist layer 110 are changed. In addition, the ALG 20 is cleaved from the first polymer 11 to form a carboxylic acid group. The first polymer 11 reacts with the second polymer 12 to form intermolecular force, and therefore the pattern of the resist layer 110 does not easily collapse.

Figure 4C:
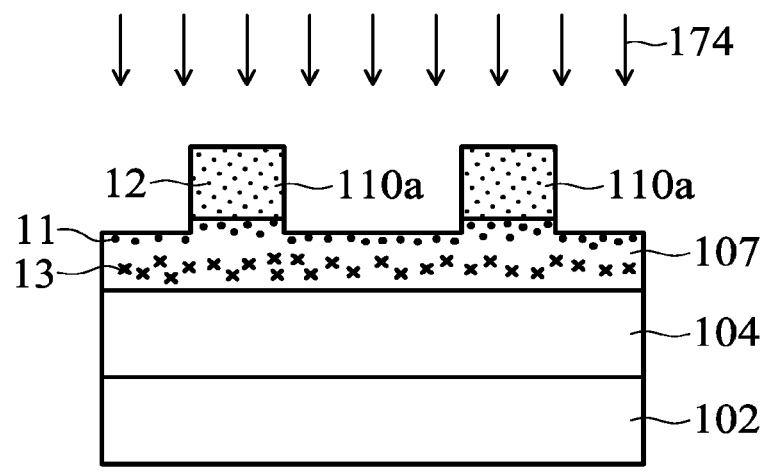

Next, as shown in FIG. 4C, the first develop process 174 is performed on the resist layer 110 to remove a portion of the resist layer 110, in accordance with some embodiments of the disclosure. As a result, the patterned resist layer 110a is obtained.

In some embodiments, the negative tone developer (NTD) process is performed, the exposed region of the resist layer 110 remains, and the unexposed region of the resist layer 110 is removed by the developer. In some embodiments, a portion of the underlying layer 107 is removed by the first develop process 174, but another portion of the underlying layer 107 is not completed removed.

Figure 4D:
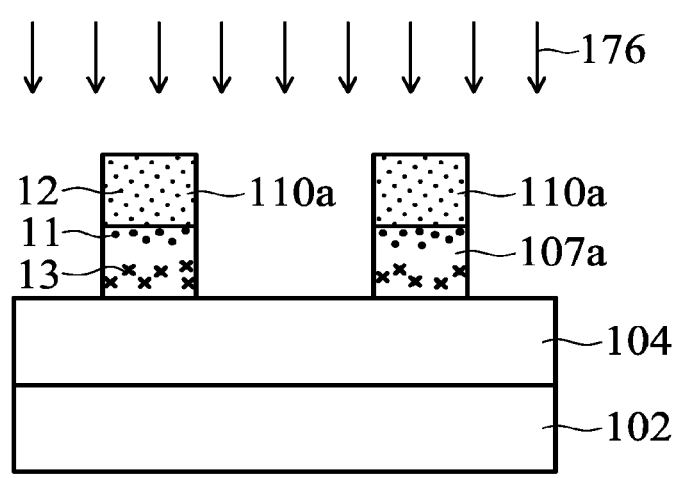

Subsequently, as shown in FIG. 4D, the underlying layer 107 is patterned by performing the second develop process 176 to form the patterned underlying layer 107a, in accordance with some embodiments of the disclosure.

It should be noted that since the resist layer 110 and the underlying layer 107 are made of different materials, the underlying layer 107 is not completely removed by the first develop process 174. Therefore, the second develop process 176 is used to remove a portion of the underlying layer 107 which is not covered by the patterned resist layer 110a.

Figure 4E:
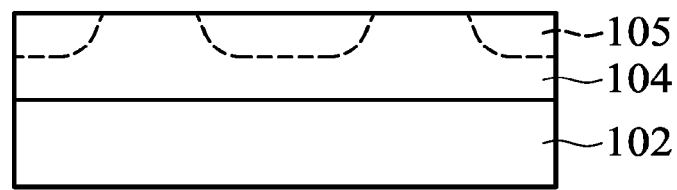

Next, as shown in FIG. 4E, a portion of the material layer 104 is doped by performing an ion implantation process and using the patterned resist layer 110a and the patterned underlying layer 107a as a mask, in accordance with some embodiments of the disclosure. As a result, a doped region 105 is formed in the material layer 104. The doped region 105 may be doped with p-type dopants, such as boron or $BF_2$, and/or n-type dopants, such as phosphorus (P) or arsenic (As). Next, the patterned underlying layer 107a and the patterned resist layer 110a are removed.

It should be noted that the first polymer 11 is close to the interface between the underlying layer 107 and the resist layer 110 by the floating group 30. The intermolecular force between the first polymer 11 and the second polymer 12 occur at the interface. The pattern of the resist layer 110 does not easily collapse due to the stronger intermolecular force between the first polymer 11 and the second polymer 12. Therefore, the collapse window is enlarged, and the line width rough (LWR) of the resist layer 110 is improved.

FIGS. 5A-5F show cross-sectional representations of various stages of forming a semiconductor structure, in accordance with some embodiments of the disclosure. The method can be used in many applications, such as fin-type field effect transistor (FinFET) device structure. Some processes and materials used to form the semiconductor device structure in FIGS. 5A-5F are similar to, or the same as, those used to form the semiconductor device structure FIGS. 1A-1E and are not repeated herein.

Figure 5A:
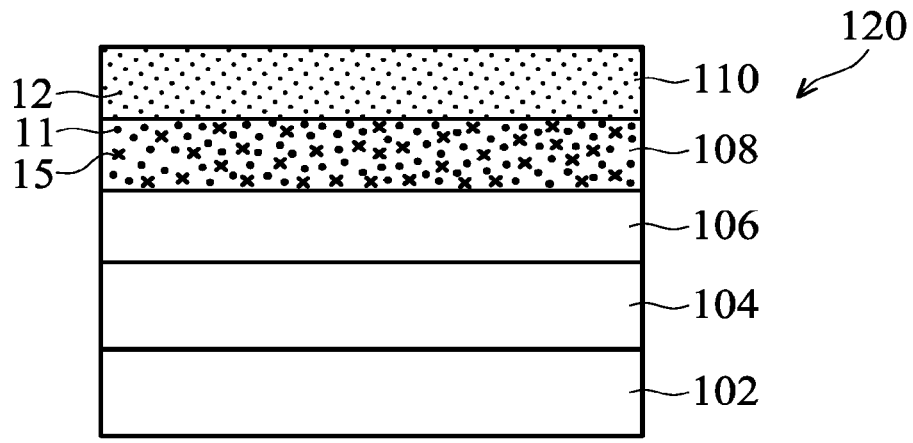
FIGS. 5A-5F show cross-sectional representations of various stages of forming a semiconductor structure, in accordance with some embodiments of the disclosure.

As shown in FIG. 5A, a tri-layer photoresist layer 120 is formed over the material layer 104 over the substrate 102. The tri-layer photoresist layer 120 includes a bottom layer 106, a middle layer 108 and the resist layer 110. The tri-layer photoresist layer 120 is used to pattern the underlying material layer and then is removed.

The middle layer 108 includes the first polymer 11 as shown in FIG. 2 and a compound 15 which have an anti-reflection property. In some embodiments, the compound 15 in the middle layer 108 includes a silicon containing layer, a silicon containing inorganic polymer, siloxane polymer (e.g., a polymer having a backbone of O—Si—O—Si). In some other embodiments, the compound 15 in the middle layer 108 includes silicon oxide, silicon nitride, silicon oxynitride, polycrystalline silicon, a metal-containing polymer material that contains metal such as titanium, aluminum, or tantalum. The middle layer 108 is formed by depositing a material including a mixture of the compound 15 and the first polymer 11 as shown in FIG. 2.

Figure 5B:
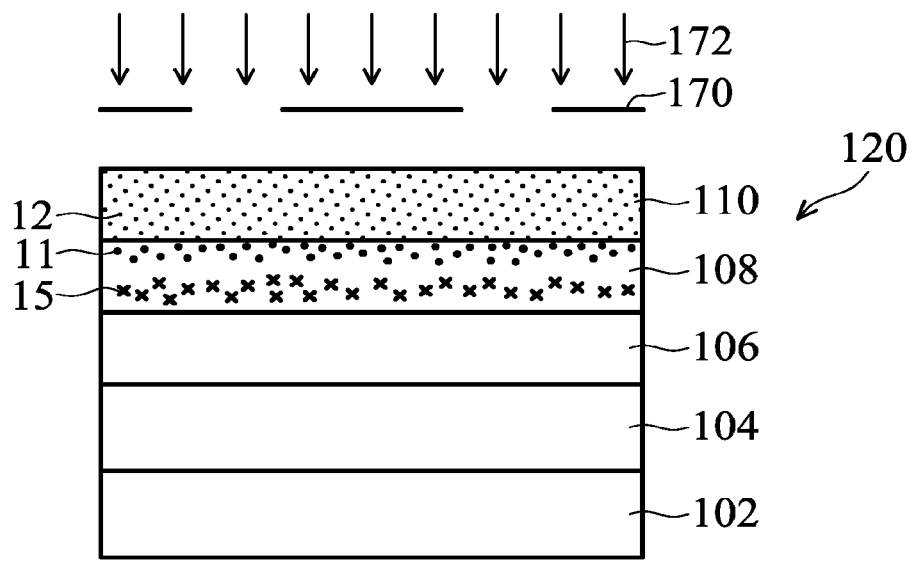

Subsequently, as shown in FIG. 5B, the mask 170 is formed over the resist layer 110, and the exposure process 172 is performed on the resist layer 110. After the exposure process 172, a post-exposure-baking (PEB) process is performed. After the PEB process, the polarity of the exposed region of the resist layer 110 is changed from hydrophobic to hydrophilic.

Figure 5C:
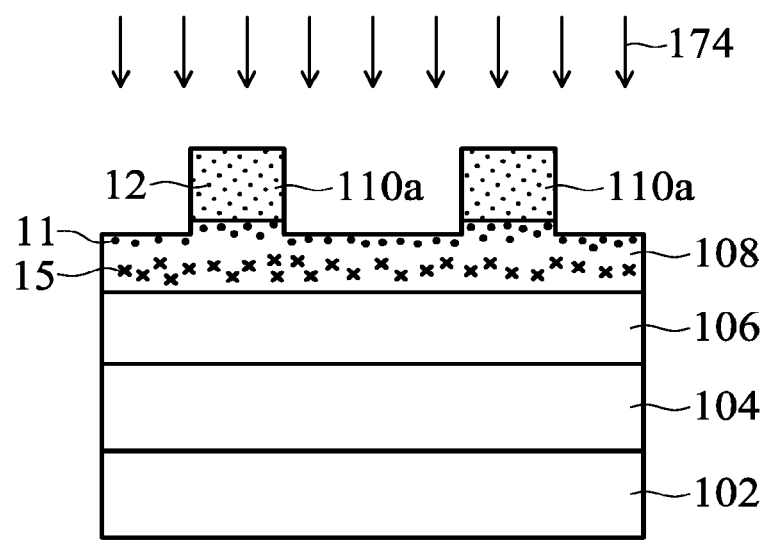

Next, as shown in FIG. 5C, the first develop process 174 is performed on the resist layer 110 to remove a portion of the resist layer 110, in accordance with some embodiments of the disclosure. As a result, the patterned resist layer 110a is obtained.

In some embodiments, the negative tone developer (NTD) process is performed, the exposed region of the resist layer 110 remains, and the unexposed region of the resist layer 110 is removed by the developer. In some embodiments, a portion of the middle layer 108 is removed by the first develop process 174, but the middle layer 108 is not completed removed since the middle layer 108 and the resist layer 110 are made of different materials.

Figure 5D:
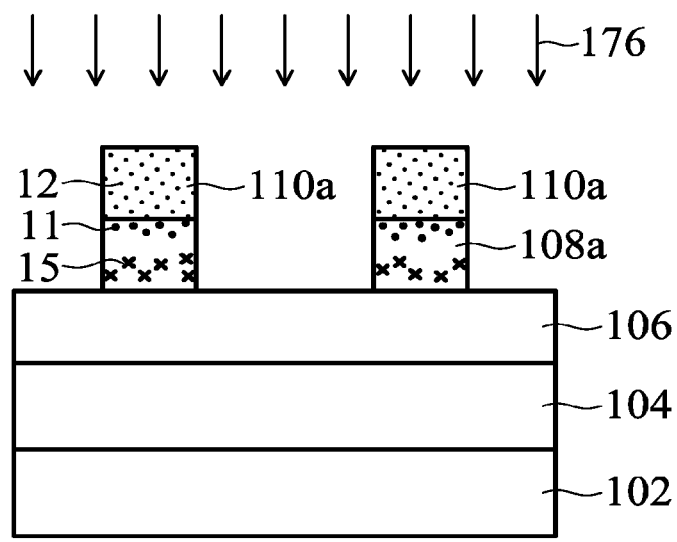

Next, as shown in FIG. 5D, the middle layer 108 is patterned by performing the second develop process 176 to form the patterned middle layer 108a, in accordance with some embodiments of the disclosure.

It should be noted that since the resist layer 110 and the middle layer 108 are made of different materials, the middle layer 108 is not completely removed by the first develop process 174. Therefore, the second develop process 176 is used to remove a portion of the middle layer 108 which is not covered by the patterned resist layer 110a.

Figure 5E:
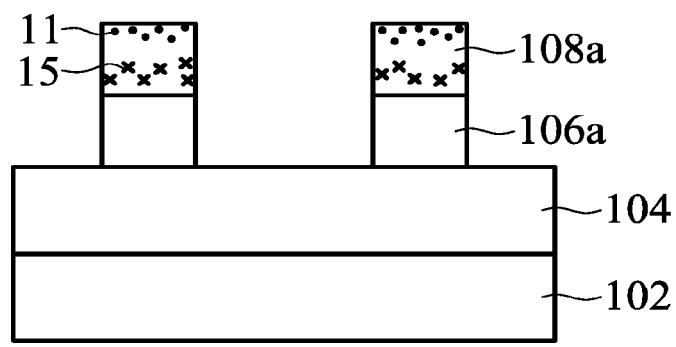

Next, as shown in FIG. 5E, the patterned resist layer 110a is removed, and then the bottom layer 106 is patterned by using the patterned middle layer 108a as a mask, in accordance with some embodiments of the disclosure.

Figure 5F:
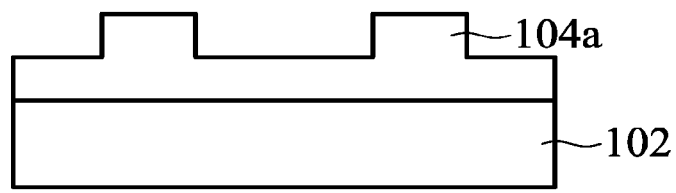

Afterwards, as shown in FIG. 5F, a portion of the material layer 104 is removed by performing an etching process and using the patterned middle layer 108a and the patterned bottom layer 106a as a mask, in accordance with some embodiments of the disclosure. As a result, a patterned material layer 104a is formed. Afterwards, the patterned middle layer 108a and the patterned bottom layer 106a are removed. In some embodiments, the patterned middle layer 108a and the patterned bottom layer 106a are removed by an etching process. The etching process includes a number of etching processes.

It should be noted that the first polymer 11 formed in the middle layer 108 is used to improve the pattern of the resist layer 110. With the help of the first polymer 11, the line width roughness (LWR) of the resist layer 110 is reduced by about 10% to about 50%. The line width roughness (LWR) of the resist layer 110 is improved for 0.1 nm to about 2 nm. In addition, the collapse window is enlarged by about 0.5 nm to about 2 nm. Therefore, the lithography resolution is improved.

The first polymer 11 in the middle layer 108 function as an adhesion layer to prevent the pattern of the resist layer 110 from collapsing. The ALG 20 in the first polymer 11 is used to form the intermolecular force with the second polymer 12. The floating group 30 is used to float the first polymer 11 to be close to the resist layer 110. Therefore, the hydrogen bonds between the first polymer 11 and the second polymer 12 occur at interface between the middle layer 108 and the resist layer 110. The line width roughness (LWR) of the pattern of the resist layer 110 is improved by forming the first polymer 11 in the middle layer 108. Therefore, the lithography resolution is improved.

Embodiments for forming a semiconductor device structure are provided. A material layer is formed over a substrate, and a resist layer is formed over the material layer. The resist layer is patterned by performing an exposure process, a baking process and an etching process. An underlying layer is formed below the resist layer to improve the pattern of the resist layer. The underlying layer includes a first polymer backbone, an acid labile (ALG) group and a floating (F) group bonded to the first polymer backbone. The underlying layer may further include silicon containing inorganic polymer or novolac resin. The ALG in the first polymer is used to form the intermolecular force with the second polymer in the resist layer. The floating group is used to float the first polymer to be close to the resist layer. A chemical bonding (e.g. hydrogen bond) between the resist layer and the underlying layer is used to prevent the resist layer from collapsing. The resist layer is firstly pattered, and the underlying layer is patterned. Afterwards, the material layer is patterned to form a semiconductor structure. The underlying layer is configured to prevent the resist layer from collapsing. Therefore, the pattern resolution of the resist layer is improved by forming the underlying layer. Furthermore, the line width rough (LWR) and the collapse window of the semiconductor structure are improved.

In some embodiments, a method for forming a semiconductor structure is provided. The method includes forming a material layer over a substrate and forming a assist layer over the material layer. The assist layer includes a polymer backbone, an acid labile group (ALG) bonded to the polymer backbone; and a floating group bonded to the polymer backbone. The floating group includes carbon fluoride (CxFy). The method also includes forming a resist layer over the assist layer and patterning the resist layer.

In some embodiments, a method for forming a semiconductor structure is provided. The method includes forming a material layer over a substrate and forming an underlying layer over the material layer. The underlying layer includes a first polymer backbone, an acid labile group (ALG) bonded to the first polymer backbone and a floating group bonded to the first polymer backbone. The ALG includes a polarity switch unit and the floating group includes carbon fluoride (CxFy). The method further includes forming a resist layer over the underlying layer, and the resist layer includes a second polymer. The method further includes exposing the resist layer by performing an exposure process, and the first polymer reacts with the second polymer to form an intermolecular force between the first polymer and the second polymer after the performing the exposure process.

In some embodiments, a method for forming a semiconductor structure is provided. The method includes forming a material layer over a substrate and forming a bottom layer over the material layer. The method also includes forming a middle layer over the bottom layer. The middle layer includes a silicon containing inorganic polymer, a first polymer backbone, an acid labile group (ALG) bonded to the first polymer backbone, and a floating group bonded to the first polymer backbone. The ALG comprises a polarity switch unit and the floating group includes carbon fluoride (CxFy). The method also includes forming a resist layer over the middle layer and patterning the resist layer.

In some embodiments, a method for forming a semiconductor structure is provided. The method includes forming an assist layer over a material layer. The assist layer includes a first polymer with a first polymer backbone, a floating group bonded to the first polymer backbone, and the floating group includes carbon fluoride (CxFy), and a second polymer. The method includes forming a resist layer over the assist layer, and the first polymer is closer to an interface between the assist layer and the resist layer than the second polymer. The method also includes patterning the resist layer.

In some embodiments, a method for forming a semiconductor structure is provided. The method includes forming an underlying layer over a material layer. The underlying layer includes a first polymer backbone, an acid labile group (ALG) bonded to the first polymer backbone, and the ALG includes a polarity switch unit, and silicon containing inorganic polymer or novolac resin. The method further includes forming a resist layer over the underlying layer, and the resist layer includes a second polymer.

In some embodiments, a method for forming a semiconductor structure is provided. The method includes forming a material layer over a substrate, and forming a bottom layer over the material layer. The method also includes forming a middle layer over the bottom layer. The middle layer includes a silicon containing inorganic polymer, a first polymer backbone, a floating group bonded to the first polymer backbone, and the floating group includes carbon fluoride (CxFy). The method also includes forming a resist layer over the middle layer, and the first polymer backbone is closer to the resist layer than the silicon containing inorganic polymer. The method further includes patterning the resist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming an assist layer over a material layer, wherein the assist layer comprises:
    a first polymer with a first polymer backbone;
    a floating group bonded to the first polymer backbone, wherein the floating group comprises carbon fluoride (CxFy); and
    a second polymer;
    forming a resist layer over the assist layer, wherein the first polymer is closer to an interface between the assist layer and the resist layer than the second polymer; and
    patterning the resist layer.

2. The method for forming the semiconductor structure as claimed in claim 1, wherein the resist layer further comprises a photo acid generator (PAG), a photo decomposable base (PDB) and a quencher (Q).

3. The method for forming the semiconductor structure as claimed in claim 1, wherein the assist layer further comprises an acid labile group (ALG) bonded to the first polymer backbone, and a weight ratio of the acid labile group (ALG) to the first polymer backbone is in a range from about 30 wt % to about 70 wt %.

4. The method for forming the semiconductor structure as claimed in claim 3, wherein the ALG comprise a polarity switch unit, and the polarity switch unit comprises acetal, acetonide or anhydride.

5. The method for forming the semiconductor structure as claimed in claim 3, wherein the ALG is bonded to the first polymer backbone via a connector, wherein the connector comprises linear, branched, cyclic or noncyclic aliphatic hydrocarbon group comprising 1 to 9 carbon atoms with hydrogen or halogen.

6. The method for forming the semiconductor structure as claimed in claim 1, wherein the carbon fluoride (CxFy) comprises substituted or unsubstituted linear, branched aliphatic hydrocarbon group comprising 1 to 9 carbon atoms.

7. The method for forming the semiconductor structure as claimed in claim 6, wherein the carbon fluoride (CxFy) comprises $C_2F_5$, $CH_2$—$CH_2$—$C_3F_7$, $C(OH)(CF_3)_2$, $COOC_4F_9$, $CH_2OC_4F_9$ or $COOC(OH)(CF_3)_2$.

8. The method for forming the semiconductor structure as claimed in claim 1, wherein patterning the resist layer comprises:
    exposing the resist layer by performing an exposure process;
    performing a baking process on the resist layer; and
    performing a developing process on the resist layer, wherein a portion of the assist layer is removed.

9. The method for forming the semiconductor structure as claimed in claim 8, wherein performing the developing process comprises using a negative tone developer (NTD).

10. A method for forming a semiconductor structure, comprising:
    forming an underlying layer over a material layer, wherein the underlying layer comprises:
    a first polymer backbone;
    an acid labile group (ALG) bonded to the first polymer backbone, wherein the ALG comprises a polarity switch unit; and
    silicon containing inorganic polymer or novolac resin; and
    forming a resist layer over the underlying layer, wherein the resist layer comprises a second polymer.

11. The method for forming the semiconductor structure as claimed in claim 10, wherein the polarity switch unit comprises acetal, acetonide or anhydride.

12. The method for forming the semiconductor structure as claimed in claim 10, wherein the ALG is bonded to the first polymer backbone via a connector, wherein the connector comprises linear, branched, cyclic or noncyclic aliphatic hydrocarbon group comprising 1 to 9 carbon atoms with hydrogen or halogen.

13. The method for forming the semiconductor structure as claimed in claim 10, wherein the underlying layer further comprises a floating group bonded to the first polymer backbone, and the floating group comprises carbon fluoride (CxFy), and the carbon fluoride (CxFy) comprises $C_2F_5$, $CH_2$—$CH_2$—$C_3F_7$, $C(OH)(CF_3)_2$, $COOC_4F_9$, $CH_2OC_4F_9$ or $COOC(OH)(CF_3)_2$.

14. The method for forming the semiconductor structure as claimed in claim 10, wherein the underlying layer comprises a first surface in contact with the material layer and a second surface in contact with the resist layer, and the first polymer backbone is closer to the second surface than the first surface.

15. The method for forming the semiconductor structure as claimed in claim 10, further comprising:
    performing a baking process on the resist layer; and
    performing a developing process on the resist layer to form a patterned resist layer.

16. The method for forming the semiconductor structure as claimed in claim 15, wherein a portion of the underlying layer is removed after performing the developing process on the resist layer.

17. A method for forming a semiconductor structure, comprising:
    forming a material layer over a substrate;
    forming a bottom layer over the material layer;
    forming a middle layer over the bottom layer, wherein the middle layer comprises:
    a silicon containing inorganic polymer;
    a first polymer backbone;
    a floating group bonded to the first polymer backbone, wherein the floating group comprises carbon fluoride (CxFy);
    forming a resist layer over the middle layer, wherein the first polymer backbone is closer to the resist layer than the silicon containing inorganic polymer; and
    patterning the resist layer.

18. The method for forming the semiconductor structure as claimed in claim 17, wherein the resist layer comprises a second polymer, wherein the first polymer reacts with the second polymer to form an intermolecular force between the first polymer and the second polymer after the performing the exposure process.

19. The method for forming the semiconductor structure as claimed in claim 17, wherein patterning the resist layer comprises:
   exposing the resist layer by performing an exposure process;
   performing a baking process on the resist layer; and
   performing a developing process on the resist layer, wherein a portion of the middle layer is removed by the developing process.

20. The method for forming the semiconductor structure as claimed in claim 19, wherein the exposure process comprises irradiating the middle layer and the resist layer by Krypton Fluoride (KrF) excimer laser, Argon Fluoride (ArF) excimer laser, Fluoride ($F_2$) Excimer Laser, or Extreme ultra-violet (EUV) light.

* * * * *